United States Patent
Ning

(10) Patent No.: US 7,710,783 B2
(45) Date of Patent: May 4, 2010

(54) METHODS FOR OPERATING A NONVOLATILE MEMORY AND RELATED CIRCUIT

(75) Inventor: Chung-Ho Ning, Baoshan Township, Hsinchu County (TW)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 595 days.

(21) Appl. No.: 11/634,095

(22) Filed: Dec. 6, 2006

(65) Prior Publication Data

US 2007/0133296 A1      Jun. 14, 2007

(30) Foreign Application Priority Data

Dec. 8, 2005     (TW) .............................. 94143436 A

(51) Int. Cl.
*G11C 11/34*     (2006.01)
(52) U.S. Cl. .............................. 365/185.22; 365/185.21
(58) Field of Classification Search ............ 365/185.22, 365/185.21
See application file for complete search history.

(56) References Cited

U.S. PATENT DOCUMENTS

| 5,757,699 | A  | * | 5/1998 | Takeshima et al. ..... 365/185.24 |
| 6,894,931 | B2 | * | 5/2005 | Yaegashi et al. ....... 365/185.22 |
| 7,158,408 | B2 |   | 1/2007 | Roesner et al. |
| 7,304,578 | B1 | * | 12/2007 | Sayers et al. ............. 340/572.3 |
| 2005/0240498 | A1 | | 10/2005 | Thaler |

FOREIGN PATENT DOCUMENTS

| CN | 1216388 A | 5/1999 |
| CN | 1243318 A | 2/2000 |
| CN | 1527239 A | 9/2004 |
| TW | 518870    | 1/2003 |

* cited by examiner

*Primary Examiner*—Son Dinh
(74) *Attorney, Agent, or Firm*—Bacon & Thomas, PLLC

(57) ABSTRACT

A method for operating a nonvolatile memory and related circuit are applied to a nonvolatile memory of an RFID tag. The operating method is for repeatedly performing a program procedure on the nonvolatile memory at least twice, and then performing an verification procedure on the nonvolatile memory.

11 Claims, 4 Drawing Sheets

METHODS FOR OPERATING A NONVOLATILE MEMORY AND RELATED CIRCUIT

This application claims the benefit of Taiwan application Serial No. 94143436, filed Dec. 8, 2005, the subject matter of which is incorporated herein by reference.

BACKGROUND OF THE INVENTION

1. Field of the Invention

The invention relates in general to a method for operating a nonvolatile memory, and more particularly to a method for programming a nonvolatile memory of a radio frequency identification (RFID) tag.

2. Description of the Related Art

Bar codes are commonly used in goods management nowadays. However, bar codes are functionless unless working along with a scan equipment. Besides, identification information, such as names, sources or purchase dates of goods can be only read by scanning the attached codes in a very short distance. If there is a tag with an antenna on the goods, it becomes very convenient to trace the goods. An RFID tag system transmits identification data in form of wireless electromagnetic waves such that the manager can manage goods in a wireless way. The RFID system is composed of a number of RFID tags and readers. Each RFID tag includes an antenna and a nonvolatile memory for storing the identification data. Each RFID tag performs data transmission with a reader via the antenna in a wireless way and performs a programming operation on the nonvolatile memory according to the received data.

However, for the conventional RFID tag, one bit of identification data (0/1) is written and then sequentially performing a verification procedure. That is, the control circuit of the RFID tag has to boost its operational voltage to write the identification data into the nonvolatile memory first. Then, the control circuit lowers down the operational voltage to read out the identification data written into the nonvolatile memory just now, and then transmits the read identification data to the reader via an antenna for verification. In this way, the operation of boosting and decreasing the operational voltage has to be repeatedly performed by 128 times for writing 128 bits of identification data into the nonvolatile memory. The conventional data program process of RFID tag wastes much time and electrical power and may result in a serious issue of current insufficiency while data programming.

SUMMARY OF THE INVENTION

It is therefore an object of the invention to provide a method for operating a nonvolatile memory so as to improve efficiency of writing identification data.

The invention achieves the above-identified object by providing a method for operating a nonvolatile memory applied to an RFID tag. The method includes repeatedly performing a program procedure on the nonvolatile memory at least twice, wherein in the program procedure, one or more than one set of bit data is written into the nonvolatile memory according to a set of to-be-programmed data; and performing an verification procedure on the nonvolatile memory for identifying whether a set of data stored in the nonvolatile memory matches the to-be-programmed data.

The invention achieves the above-identified object by providing a method for operating a nonvolatile memory in an RFID tag. The method includes repeatedly writing a plurality of sets of bit data into the nonvolatile memory according to a set of to-be-programmed data; and identifying whether the sets of bit data stored in the nonvolatile memory are correct according to the to-be-programmed data.

The invention achieves the above-identified object by providing an RFID tag circuit including a control circuit, a lock bit and a nonvolatile memory. The lock bit is coupled to the control circuit. The nonvolatile memory is coupled to the control circuit. The control circuit successively writes a plurality of sets of bit data into the nonvolatile memory according to to-be-programmed data.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention is applied to a nonvolatile memory of an RFID tag for repeatedly performing a program procedure on the nonvolatile memory at least twice and then consequently performing a verification procedure. The program procedure is for writing one or more than one bit of data into the nonvolatile memory. Therefore, the frequency for changing operational voltages and time for writing data into the nonvolatile memory can be reduced, thereby improving data programming efficiency and accuracy.

Figure 1:
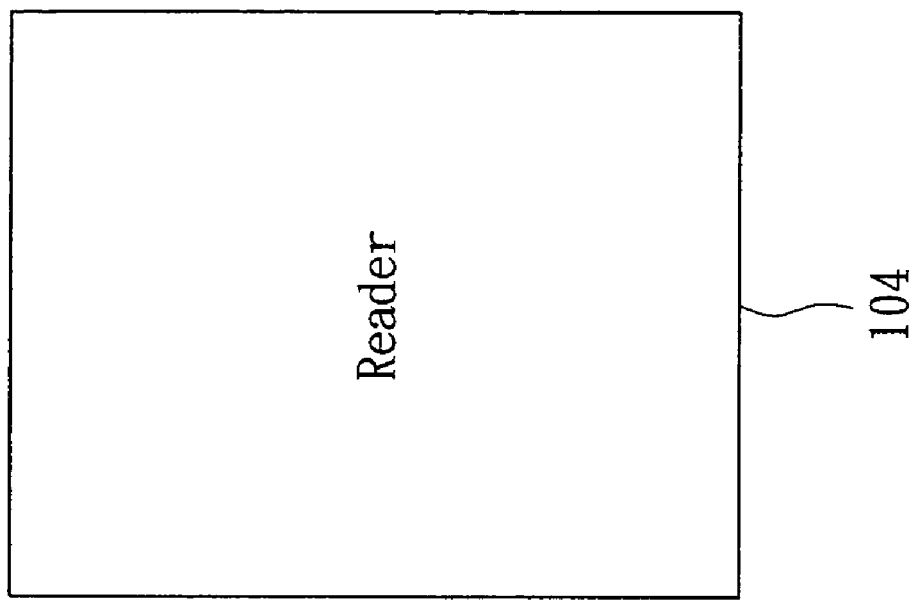
FIG. 1 is a functional diagram of an RFID system.
Figure 1:
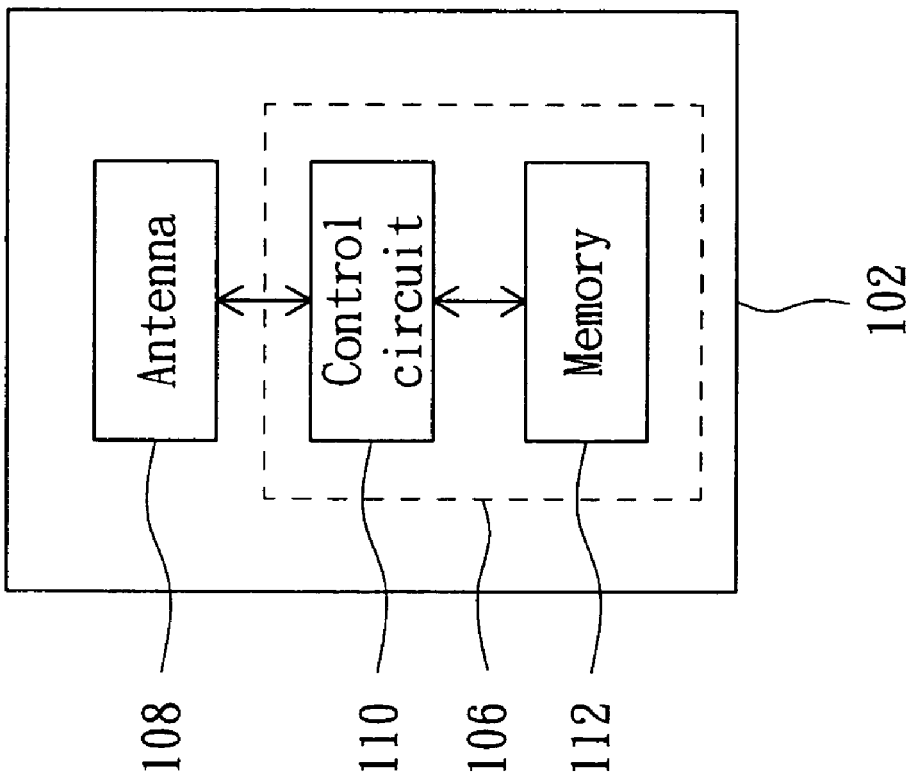

Referring to FIG. 1, a functional diagram of an RFID system is shown. An RFID system 100 includes an RFID tag 102, a reader 104 and a system for controlling the reader 104 or processing data of the reader 104 (not shown in the figure). The RFID tag 102 includes a chip (or die) 106 and an antenna 108. The chip 106 includes a control circuit 110 and a nonvolatile memory 112 and the control circuit 110 includes an analog circuit and a digital circuit (not shown in the figure). The analog circuit is coupled between the antenna 108 and the digital circuit for transceiving wireless signals through the antenna 108 from/to the digital circuit. Therefore, the digital circuit performs associated access operations on the nonvolatile memory 112. It should be noted that for most types of nonvolatile memory 112, the voltage level required for writing identification information into the nonvolatile memory 112 is much higher than that for reading data of the nonvolatile memory 112. Take a flash memory as an example. Normally, it requires an operational voltage of +12V to write data into the nonvolatile memory 112 while it requires an operational voltage of +3.3V to read data of the nonvolatile memory 112.

Figure 2:
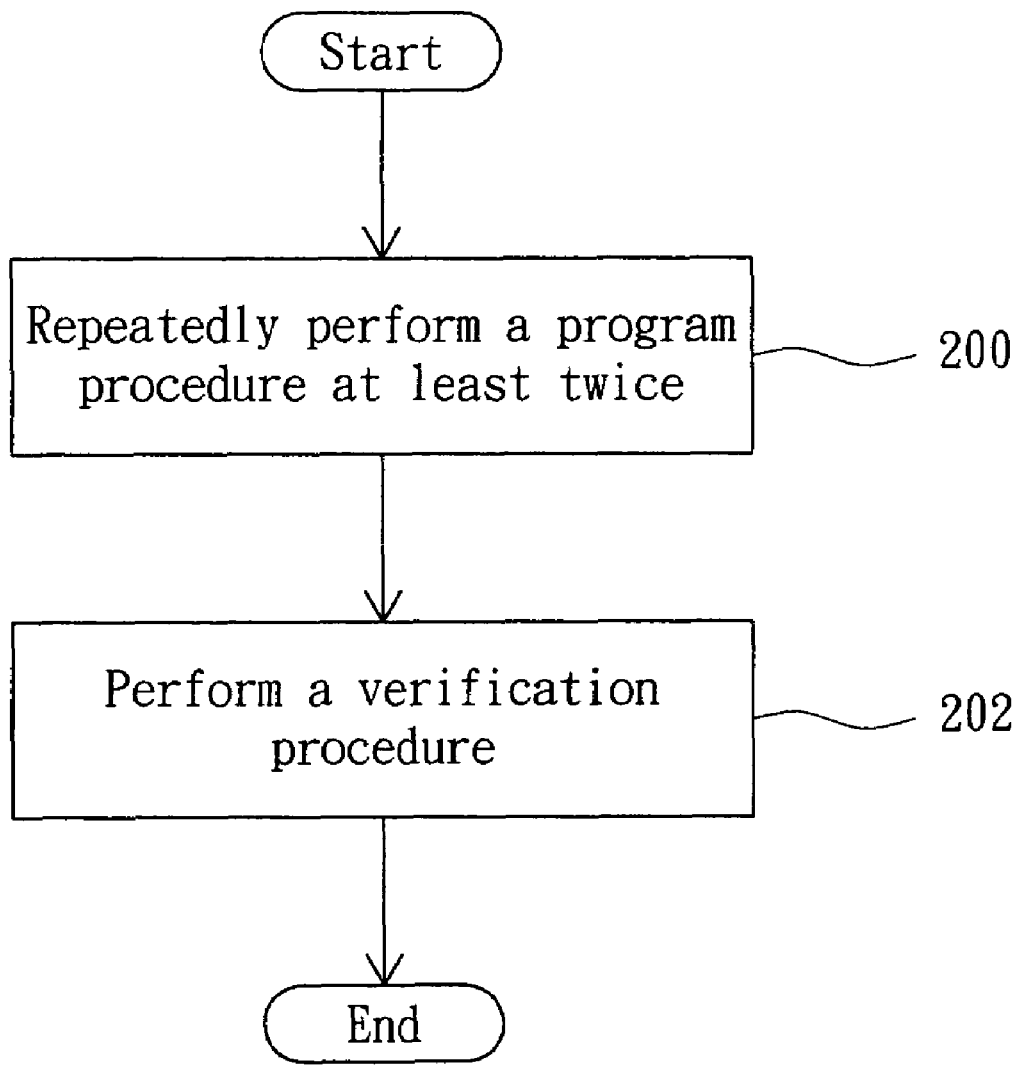
FIG. 2 is a flow chart of a method for operating a nonvolatile memory according to a preferred embodiment of the invention.

Referring to FIG. 2, a flow chart of a method for operating a nonvolatile memory according to a preferred embodiment of the invention is shown. Firstly, in step 200, repeatedly perform a program procedure on the nonvolatile memory 112 at least twice. The program procedure is for writing one or more than one bit of identification data into the nonvolatile memory 112 at a time according to the to-be-programmed identification data. Next, in step 202, perform a verification procedure on the nonvolatile memory 112 after completing the program procedure. The verification procedure identifies whether the identification data stored in the nonvolatile memory 112 match the to-be-programmed identification data.

For example, the nonvolatile memory 112 has a storage volume of 128 bits. The program procedure writes one or more than one bit of identification data, such as 1 bit, 4 bits or 8 bits of identification data, at a time in accordance with design of the control circuit 110. For example, the program procedure programs 8 bits of identification data at a time and the identification data to be programmed are 128 bits. In the step 200, the control circuit 110 boosts the operational voltage for repeatedly performing the program procedure on the nonvolatile memory 112 at least twice, that is, repeatedly performing the program procedure twice to write 16 bits of identification data into the nonvolatile memory 112. Alternatively, repeatedly perform the program procedure by M times to write 8×M bits of identification data into the nonvolatile memory 112. Preferably, the program procedure is performed multiple times to write 128 bits of identification data into the nonvolatile memory 112 thoroughly. Afterwards, in the step 202, perform a verification procedure on the nonvolatile memory 112. The step 202 is performed after the program procedure is performed repeatedly at least twice. Preferably, the verification procedure is performed after the 128 bits, all, of identification data are written into the nonvolatile memory 112. For example, when the program procedure has been performed twice, the control circuit 110 decreases the operational voltage so as to perform a read operation on the 16 bits of data of the nonvolatile memory 112 for verification. The verification procedure identifies whether the identification data written in the step 200 match the to-be-programmed identification data, for example originally stored in the reader.

In this embodiment, the program procedures are successively performed and then the verification procedure is performed. Preferably, the verification procedure is performed after the identification data are completely written into the nonvolatile memory 112. Therefore, the frequency for the control circuit 110 to boost the operational voltage and the time for programming the identification data can be reduced, thereby improving efficiency for programming the identification data and reducing power consumption of the RFID tag. The issue of current insufficiency while data programming can be thus avoided.

In addition, for the process of performing the program procedure (i.e. the step 200), for example, if a bit data (0/1) of the to-be-programmed identification data is different from an initial bit data (1/0) originally stored in the corresponding address of the nonvolatile memory 112, then the program procedure writes the bit data into the corresponding address of the nonvolatile memory 112, otherwise the bit data is not rewritten into the corresponding address of the nonvolatile memory 112. Furthermore, preferably, in initialization, all bits of the nonvolatile memory 112 are programmed as the same value "0" or "1", which is called a pre-program operation. Following that, in the program procedure, the programming operation is not actually required when the same value is to be programmed. For example, when the to-be-programmed data is "1" and the corresponding address of the nonvolatile memory is initially programmed as "1", the operation of programming "1" is not actually performed. Therefore, the time and power for programming identification data can be further reduced.

Figure 3:
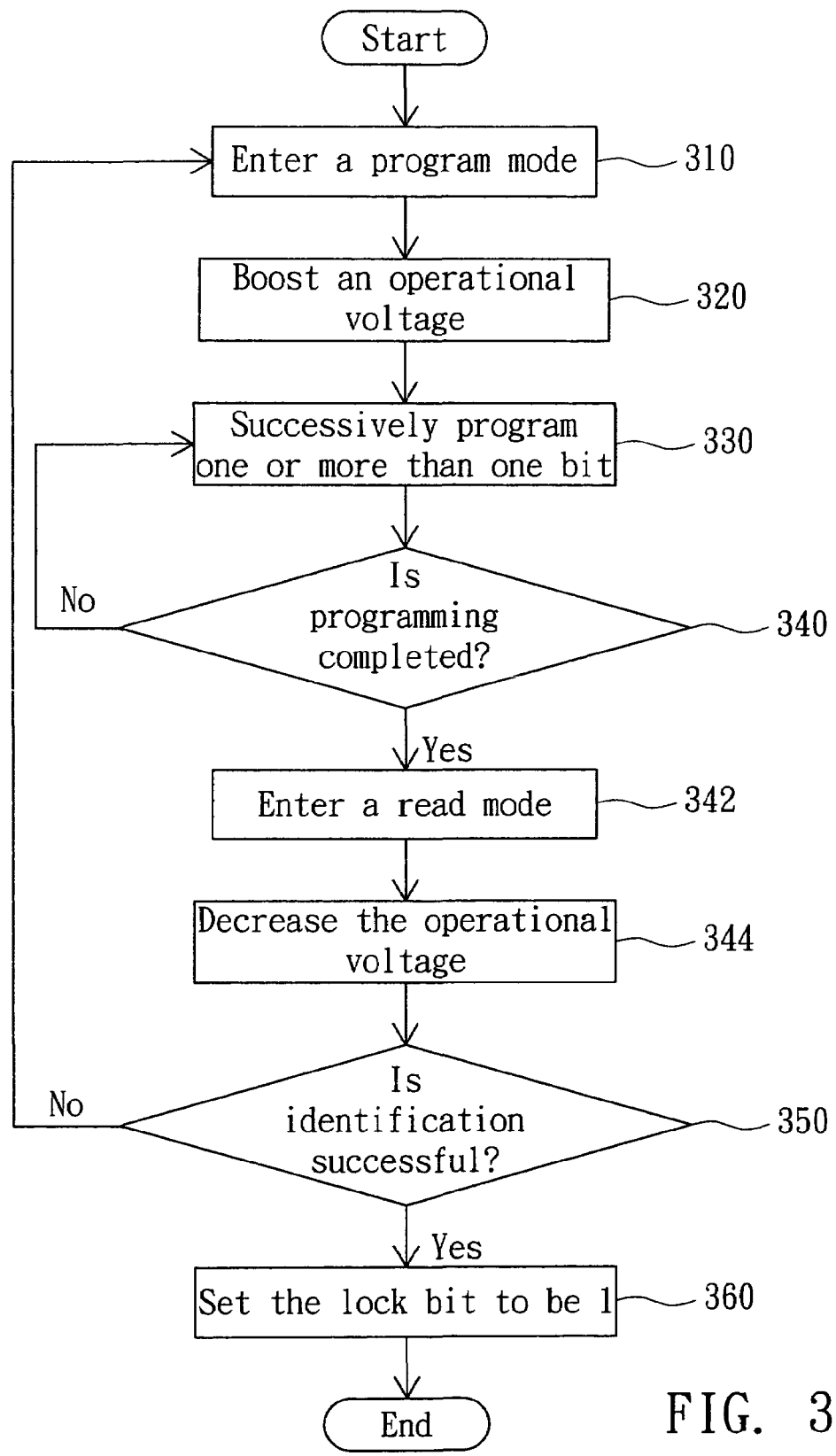
FIG. 3 is a program process according to a preferred embodiment of the invention.

Referring to FIG. 3, a program process according to a preferred embodiment of the invention is shown. In step 310, the RFID tag 102 enters a program mode. In step 320, the RFID tag 102 boosts the operational voltage. Next, in step 330, the RFID tag 102 programs one or more than one bit, such as 1 bit, 4 bits or 8 bits, of identification data. In step 340, determine if the program procedure is completed. If yes, proceed to a step 342. If no, return to the step 330 to continue programming the identification data. Therefore, in the steps 320 to 340, the RFID tag 102 successively programs one or more than one bit of identification data and programs 1 bit, 4 bits or 8 bits of identification data at a time. In this embodiment, after the identification data are completely programmed, in the step 342, the flowchart enters a read mode. Afterwards, in step 344, the RFID tag 102 decreases the operational voltage. In step 350, identify whether the identification data of the RFID tag 102 are correct. If the identification is failed, return to the step 310 to enter the program mode again to re-program the identification data. If the identification is successful, proceed to a step 360 to set a lock bit to be 1 and the process is ended. In this embodiment, after the identification data are programmed, they can be protected by the lock bit and cannot be overwritten casually. The verification procedure is performed after the identification data are completely programmed, thereby greatly reducing the frequency of boosting voltages for programming identification data.

Figure 4:
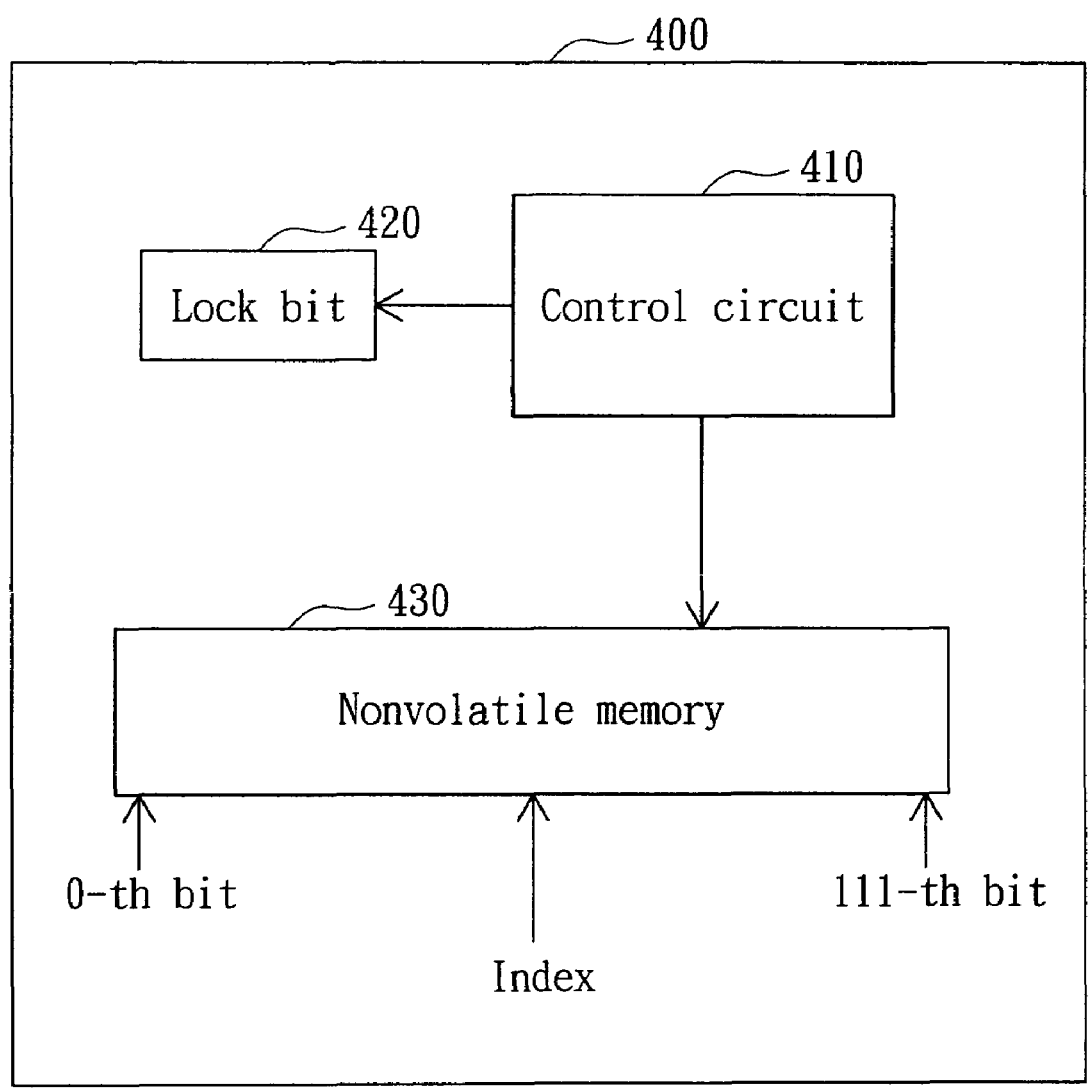
FIG. 4 is an RFID tag circuit according to a preferred embodiment of the invention.

FIG. 4 shows an RFID tag circuit according to a preferred embodiment of the invention. The RFID tag circuit, which can be implemented in a chip (or die), includes a control circuit 410, a lock bit 420 and a nonvolatile memory 430. The control circuit 410 is coupled to the lock bit 420 and the nonvolatile memory 430. For example, 112 bits of identification data are programmed in a 900 MHz protocol. The following description is given in combination with the above-mentioned process. During initialization, all bits of the nonvolatile memory 430 are configured to be 1. Following that, in a program period, the program operation is actually performed only when "0" is to be programmed. When "1" is to be programmed, the tag circuit 400 immediately responds that the bit has been programmed and thus no program operation is actually performed. Therefore, the programming time and frequency of boosting voltages can be minimized. After the system completes programming the 112 bits of data and all the data pass verification, the control circuit 410 sets the lock bit 420 to be 1, which represents that 112 bits have been configured completely and protected from being overwritten casually.

The nonvolatile memory of RFIDs disclosed by the above embodiment of the invention can effectively improve efficiency for programming identification data and can be compatible with any well-known program process.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a nonvolatile memory, applied to a radio frequency identification (RFID) tag, the RFID tag having the nonvolatile memory, the method comprising:

successively performing a program procedure on the nonvolatile memory at least twice, wherein in the program procedure, a plurality of bits of data are written into the nonvolatile memory according to to-be-programmed data; and performing a verification procedure on the nonvolatile memory for identifying whether the bits of data written in the nonvolatile memory by successively performing the program procedure at least twice match the to-be-programmed data.

2. The method according to claim 1, wherein the step of successively performing a program procedure successively performs the program procedure on the nonvolatile memory by a plurality of times in order to completely write the to-be-programmed data into the nonvolatile memory.

3. The method according to claim 2, wherein the verification procedure is performed after the program procedure has been successively performed by the plurality of times.

4. The method according to claim 1, wherein the verification procedure is performed after the program procedure has been successively performed twice.

5. The method according to claim 1, wherein if a bit data of the to-be-programmed data is different from an initial bit data stored in a corresponding address of the nonvolatile memory, the step of successively performing a program procedure writes the bit data of the to-be-programmed data into the corresponding address of the nonvolatile memory, and otherwise, the bit data of the to-be-programmed data is not rewritten into the corresponding address of the nonvolatile memory.

6. The method according to claim 1, wherein the RFID tag further comprises a control circuit and in the step of performing the verification procedure, the control circuit reads the data stored in the nonvolatile memory and transmits the data to a reader for verification via an antenna of the RFID tag.

7. An RFID tag circuit, comprising:
a control circuit;
a lock bit, coupled to the control circuit; and
a nonvolatile memory, coupled to the control circuit, wherein the control circuit is configured to successively perform a program procedure on the nonvolatile memory at least twice, in the program procedure a plurality of bits of data are written into the nonvolatile memory according to a plurality of to-be-programmed data and a verification procedure is performed on the nonvolatile memory for identifying whether the bits of data written in the nonvolatile memory by successively performing the program procedure at least twice match the to-be-programmed data.

8. The RFID tag circuit according to claim 1, wherein in the program procedure, 4 bits or 8 bits of data are written into the nonvolatile memory.

9. The RFID tag circuit according to claim 1, wherein the to-be-programmed data are 128 bits.

10. The RFID tag circuit according to claim 7, wherein when the to-be-programmed data are completely written into the nonvolatile memory and content of the nonvolatile memory is verified to be correct, the control circuit sets the lock bit to prevent data in the nonvolatile memory from being overwritten casually.

11. The RFID tag circuit according to claim 7, wherein when the to-be-programmed data are completely written into the nonvolatile memory, a reader verifies whether the content of the nonvolatile memory is correct according to the to-be-programmed data for the control circuit.

* * * * *